United States Patent
Kang et al.

(10) Patent No.: US 7,495,716 B2
(45) Date of Patent: Feb. 24, 2009

(54) FLAT PANEL DISPLAY AND METHOD OF MANUFACTURING THE SAME

(75) Inventors: Tae-Wook Kang, Suwon-si (KR); Chang-Yong Jung, Suwon-si (KR)

(73) Assignee: Samsung Mobile Display Co., Ltd., Suwon-si, Gyeonggi-do (KR)

( * ) Notice: Subject to any disclaimer, the term of this patent is extended or adjusted under 35 U.S.C. 154(b) by 375 days.

(21) Appl. No.: 11/502,630

(22) Filed: Aug. 11, 2006

(65) Prior Publication Data

US 2007/0035239 A1   Feb. 15, 2007

(30) Foreign Application Priority Data

Aug. 11, 2005   (KR) .............. 10-2005-0073775

(51) Int. Cl.
*G02F 1/136* (2006.01)
*G02F 1/13* (2006.01)
*H01J 1/62* (2006.01)

(52) U.S. Cl. .............. 349/43; 349/42; 349/187; 313/504

(58) Field of Classification Search .............. 349/43, 349/41, 42, 45, 46, 47, 48, 73, 74, 187, 191, 349/192; 313/504
See application file for complete search history.

(56) References Cited

U.S. PATENT DOCUMENTS

| | | | | |
|---|---|---|---|---|
| 6,828,657 B2 * | 12/2004 | Hara et al. | .............. | 257/623 |
| 6,924,508 B2 * | 8/2005 | Yoneda et al. | .............. | 257/72 |
| 7,057,338 B2 * | 6/2006 | Hamada et al. | .............. | 313/504 |
| 2003/0168972 A1 * | 9/2003 | Hamada et al. | .............. | 313/504 |
| 2005/0218799 A1 * | 10/2005 | Hamada | .............. | 313/506 |
| 2007/0035239 A1 * | 2/2007 | Kang et al. | .............. | 313/504 |

FOREIGN PATENT DOCUMENTS

KR   10-2002-0092036   12/2002

* cited by examiner

*Primary Examiner*—Brian M Healy
(74) *Attorney, Agent, or Firm*—Lee & Morse, P.C.

(57) ABSTRACT

A flat panel display includes a substrate having a pixel region and a non-pixel region, the substrate having a transistor in the pixel region and a pad in the non-pixel region, a first planarizing layer in the pixel region covering the transistor and including a via hole exposing a portion of the transistor, and a second planarizing layer in the non-pixel region and having a pad contact hole opening the pad, the second planarizing layer being thinner than the first planarizing layer.

20 Claims, 14 Drawing Sheets

FLAT PANEL DISPLAY AND METHOD OF MANUFACTURING THE SAME

BACKGROUND OF THE INVENTION

1. Field of the Invention

The present invention relates to a flat panel display. More particularly, the present invention relates to a flat panel display and method of manufacturing the same.

2. Description of the Related Art

Flat panel displays, e.g., an organic light emitting display (OLED) and a liquid crystal display (LCD), are thin and have low voltage operation, and have been replacing bulky, high voltage operation cathode ray tubes (CRTs) as display devices.

The OLED is a self-emitting display device in which electrons and holes injected into organic material through an anode and a cathode are recombined to generate excitons, and light with a certain wavelength is emitted by the generated excitons. Thus, the OLED, unlike an LCD, does not require a separate light source, e.g., a backlight, and, thus, consumes less power while realizing a wide viewing angle and a high response speed.

OLEDs may be divided into a passive matrix type and an active matrix type depending on a driving method thereof. Recently, active matrix type OLEDs have been employed, due to their low power consumption, high precision, high response speed, wide viewing angle and small thickness. In such an active matrix type OLED, a pixel region for light emitting or display is formed on a substrate, and a non-pixel region is formed on the substrate surrounding the pixel region.

Pixels serving as the basic unit for image representation may be arranged in a matrix on the pixel region. Light emitting elements may include a first electrode, e.g., an anode, a light emitting layer and a second electrode, e.g., a cathode, stacked in that order, and may be provided for each of the pixels. The light emitting layer may be made of an organic material for generating red (R), green (G) and blue (B) colors, respectively. A transistor, e.g., a thin film transistor (TFT), may be connected to the light emitting elements and may be arranged for each of the pixels to separately control the pixels. Pads may be formed on the non-pixel region and may be electrically connected to the pixels. The electric signals generated from an external driving circuit may be applied to the pixels through these pads.

The external driving circuit may be connected to the pads through, e.g., a flexible printed circuit (FPC), a chip on glass (COG) or a tape carrier package (TCP). The FPC and COG may be connected to the pads using an adhesive, e.g., an anisotropic conductive film (ACF).

In a method of manufacturing the active matrix type OLED, the TFT and the pad may be formed on the pixel region and the non-pixel region of the substrate, respectively. Then, a planarizing layer may be formed on the overall surface of the substrate so as to cover the TFT and the pad. The planarizing layer may then be patterned so as to expose a portion of the TFT and the pad, and a light emitting element may be formed on the planarizing layer in the pixel region so as to connect with the TFT.

The planarizing layer may be made of an organic material, e.g., acryl, and may be relatively thick in order to remove a step due to a height difference between the pixel region and the non pixel region. However, the thicker the planarizing layer becomes, the more a height difference between the pad of the non-pixel region and the planarizing layer increases. Therefore, conductive balls of the ACF may not be sufficiently compressed when connecting, e.g., the FPC and COG to the pads. Thus, contact failure may occur between the pads and the FPC and COG.

SUMMARY OF THE INVENTION

The present invention is therefore directed to a flat panel display and method of manufacturing the same, which substantially overcome one or more of the problems due to the limitations and disadvantages of the related art.

It is therefore a feature of an embodiment of the present invention to provide a flat panel display configured to prevent contact failure between pads and FPC and/or COG.

It is therefore a feature of an embodiment of the present invention to provide a method of manufacturing the flat panel display so as to reduce or eliminate contact failure.

At least one of the above and other features and advantages of the present invention may be realized by providing a flat panel display including a substrate including a pixel region and a non-pixel region, the substrate having a transistor in the pixel region and a pad in the non-pixel region, a first planarizing layer in the pixel region covering the transistor and including a via hole exposing a portion of the transistor, and a second planarizing layer in the non-pixel region and having a pad contact hole opening the pad, the second planarizing layer being thinner than the first planarizing layer.

The second planarizing layer may cover whole or both sides and an upper portion in the edge of the pad. The second planarizing layer may expose a space between the pads.

The first and second planarizing layers may be made of a same material, e.g., an organic material.

The flat panel display may include a light emitting element formed on the pixel region and connected to the transistor. The light emitting element may include a first electrode, an organic light emitting layer and a second electrode stacked in that order.

The pad may contact conductive balls and a thickness of the second planarizing layer on the pad may be smaller than a diameter of the conductive ball.

At least one of the above and other features and advantages of the present invention may be realized by providing a method of manufacturing a flat panel display, including providing a substrate including a pixel region and a non-pixel region, the substrate having a transistor in the pixel region and a pad in the non-pixel region, forming a planarizing layer on the pixel and non-pixel regions, and patterning the planarizing layer to form a first planarizing layer in the pixel region and a second planarizing layer in the non-pixel region, the first planarizing layer having a via hole exposing a portion of the transistor, the second planarizing layer having a pad contact hole opening the pad and being thinner than the first planarizing layer.

The second planarizing layer may cover whole or both sides and the upper portion in the edge of the pad. The second planarizing layer may expose a space between the pads.

The planarizing layer may be an organic material, e.g., a photosensitive organic material.

The patterning the planarizing layer may include exposing the planarizing layer using a halftone photo mask as a photo mask, and developing the exposed planarizing layer. The patterning the planarizing layer may include exposing the planarizing layer using a first photo mask, re-exposing the exposed planarizing layer using a second photo mask having different transmission regions from the first photo mask, and developing the re-exposed planarizing layer.

The method may further include forming a light emitting element on the first planarizing layer, the light emitting element electrically connecting with the transistor through the via hole.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 10-2005-0073775, filed on Aug. 11, 2005, in the Korean Intellectual Property Office, and entitled: "Flat Panel Display and Method of Manufacturing the Same," is incorporated by reference herein in its entirety.

The present invention will now be described more fully hereinafter with reference to the accompanying drawings, in which exemplary embodiments of the invention are illustrated. The invention may, however, be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A flat panel display according to an embodiment of the present invention will be described with reference to FIG. 1. In this exemplary embodiment, the flat panel display is an organic light emitting display (OLED) 100. However, the present invention may be used with other types of flat panel displays.

Figure 1:
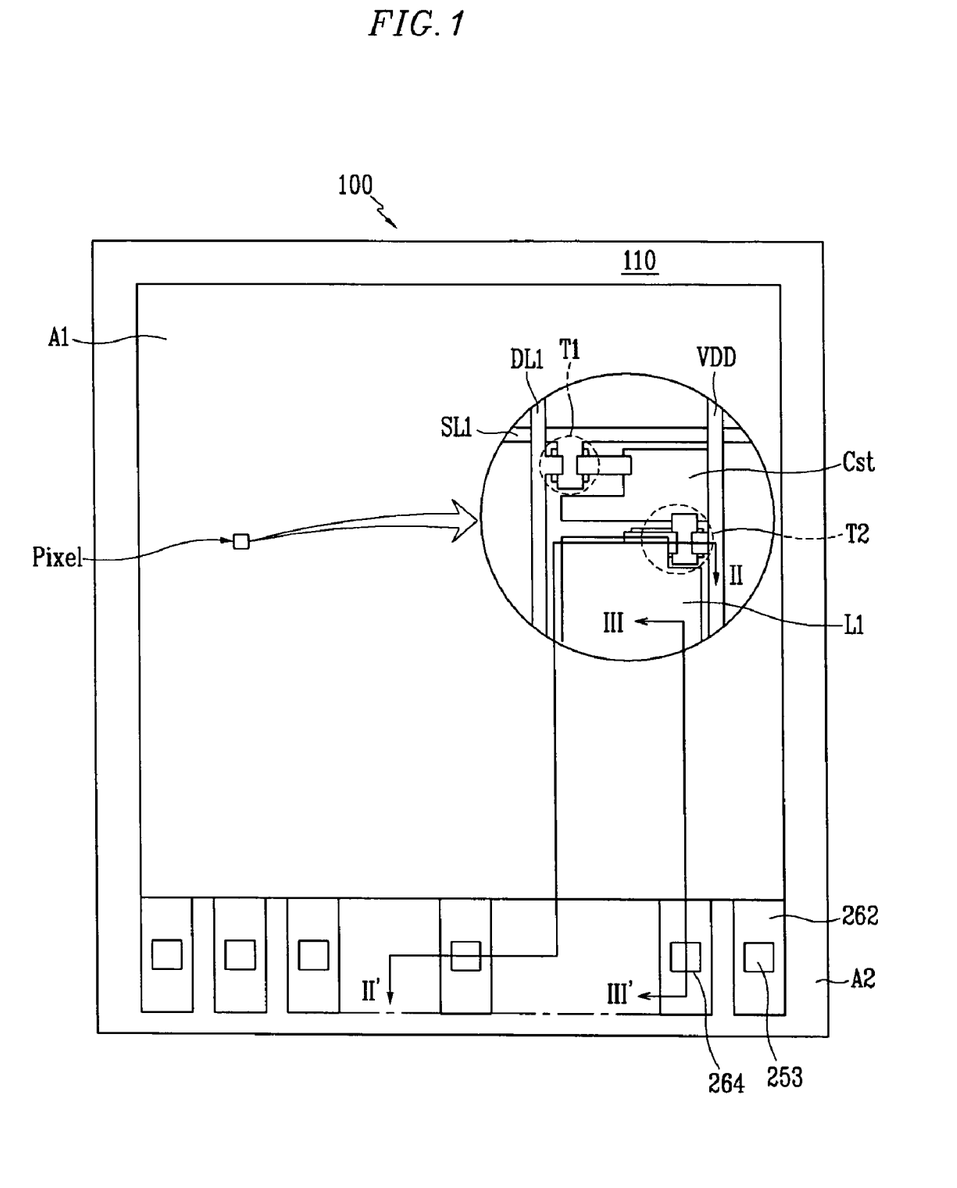
FIG. 1 illustrates a plan view of a flat panel display according to an embodiment of the present invention.

Referring to FIG. 1, a pixel region A1 for light emitting or image representation may be formed on a substrate 110, and a non-pixel region A2 may be formed on the substrate 110 surrounding the pixel region A1. Pixels may be arranged in the form of a matrix on the pixel region A1. Pads 253 may be electrically connected to the pixels, e.g., pads 253 may contact pixel data lines DL1 on the non pixel-region A2.

The substrate 110 may be made of an insulating material, e.g., glass or plastic, or of a conductive material, e.g., a metal, such as stainless steel (SUS). When the substrate 110 is made of a conductive material, an insulating layer may be further formed on the substrate 110.

Describing the pixel in more detail, a scan line SL1 may be arranged on the substrate 110. The data line DL1 and a power line VDD may be arranged to be perpendicular to the scan line SL1 and parallel to one another. First and second transistors, e.g., TFTs, T1 and T2, a storage capacitor Cst and a light emitting element L1 may be formed in a space defined by the scan line SL1, the data line DL1 and the power line VDD.

The first TFT T1 may be connected to the scan line SL1 and the data line DL2, and may transmit data voltage input from the data line DL1 to the second TFT T2 depending on a switching voltage input from the scan line SL1. The storage capacitor Cst may be connected to the first TFT T1 and a power line VDD, and may store the voltage (Vgs) corresponding to the difference between the voltage transmitted from the first TFT T1 and the voltage applied to the power line VDD. The second TFT T2 may be connected to the power line VDD and the storage capacitor Cst, and may supply the output current (Id), which is proportional to the square of a voltage corresponding to the difference between the voltage stored in the storage capacitor Cst and a threshold voltage Vth for the light emitting element L1. The light emitting element L1 may emit light in response to the output current Id. The output current Id may satisfy the following equation (1), where $\beta$ is a scaling value.

$$I_d = (\beta/2) \times (V_{gs} - V_{th})^2 \tag{1}$$

As illustrated in the exemplary embodiment of FIG. 1, the pixel may include two TFTs T1 and T2, and one storage capacitor Cst. However, the configuration of the TFTs and the storage capacitor is not limited to this, but may be altered in various manners.

The TFT T2 and the light emitting element L1 in the pixel region A1 and the pad 253 in the non-pixel region A2 will be described with reference to FIG. 2 and FIG. 3.

An active layer 210 may be formed on the substrate 100 in the pixel region A1, and a gate insulating layer 220 may be formed on the entire surface of the substrate 110. The active layer 210 may have source and drain regions 211 and 213, and a channel region 212 therebetween. A buffer layer (not shown) may be also formed between the active layer 210 and the substrate 110. The buffer layer may be made of, e.g., a silicon nitride (SiN) layer or stacked structure of the silicon nitride (SiN) layer and a silicon oxide (SiO$_2$) layer.

A gate electrode 230 may be formed on the gate insulating layer 220 corresponding to the channel region 212 of the active layer 210. An intermediate insulating layer 240 may be formed on the gate insulating layer 220 so as to cover the gate electrode 230. Source and drain electrodes 251 and 252 may be formed on the intermediate insulating layer 240 to complete TFT T2 in the pixel region A1, and the pad 253 may be formed on the intermediate insulating layer 240 in the non-pixel region A2. The source and drain electrodes 251 and 252 may be respectively electrically connected to the source and drain regions 211 and 213 through first contact holes 221 and 241 and second contact holes 222 and 242 provided in the intermediate insulating layer 240.

Figure 2:
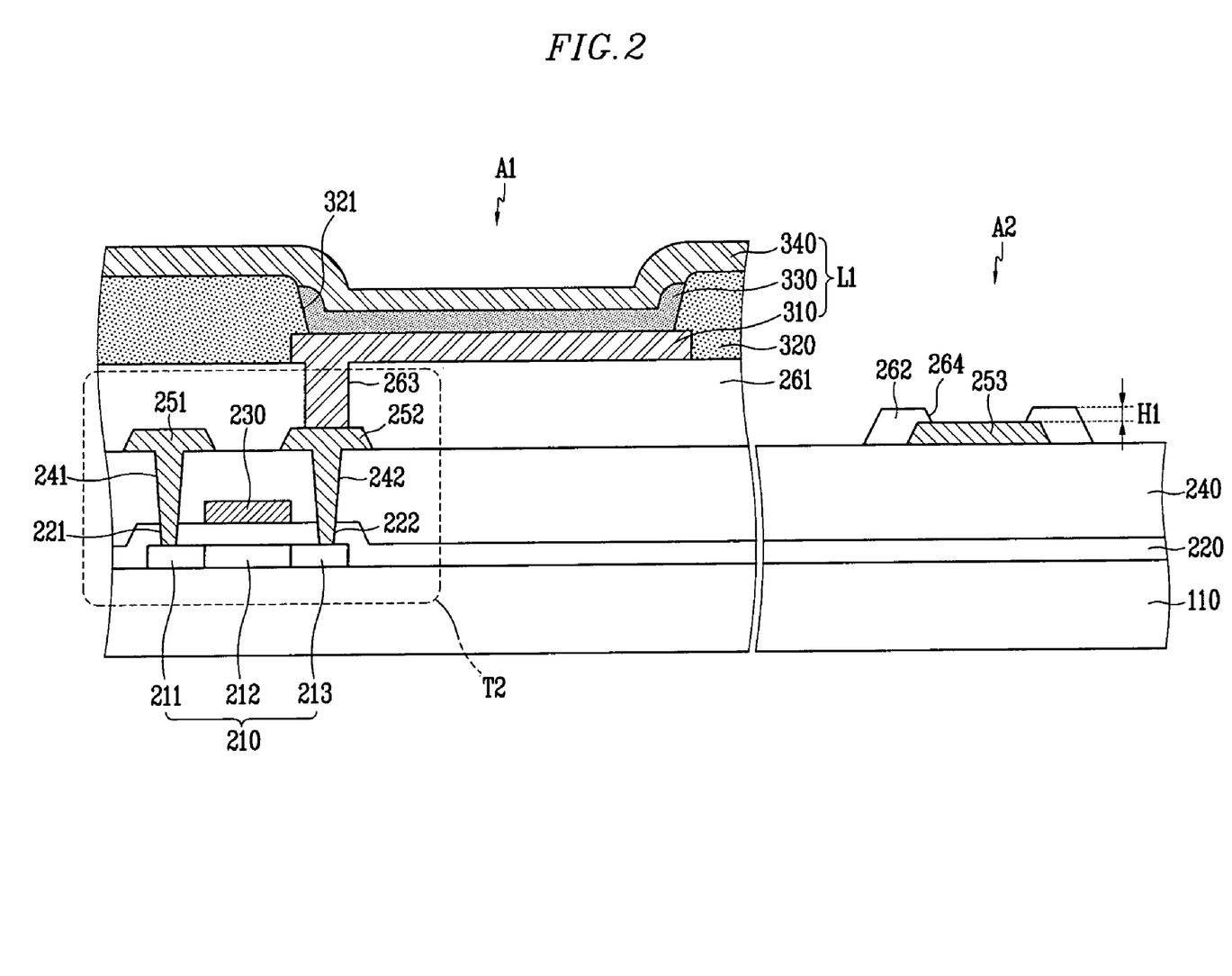
FIG. 2 illustrates a cross-sectional view of the flat panel display taken along line II-II' of FIG. 1.

In the exemplary embodiment illustrated in FIG. 2, the TFT T2 has a structure where the gate insulating layer 220, the gate electrode 230, and the source and drain electrodes 251 and 252 are stacked on the active layer 210 in that order. However, the structure of the TFT is not limited to the illustration, but may be altered in various manners.

Figure 4:
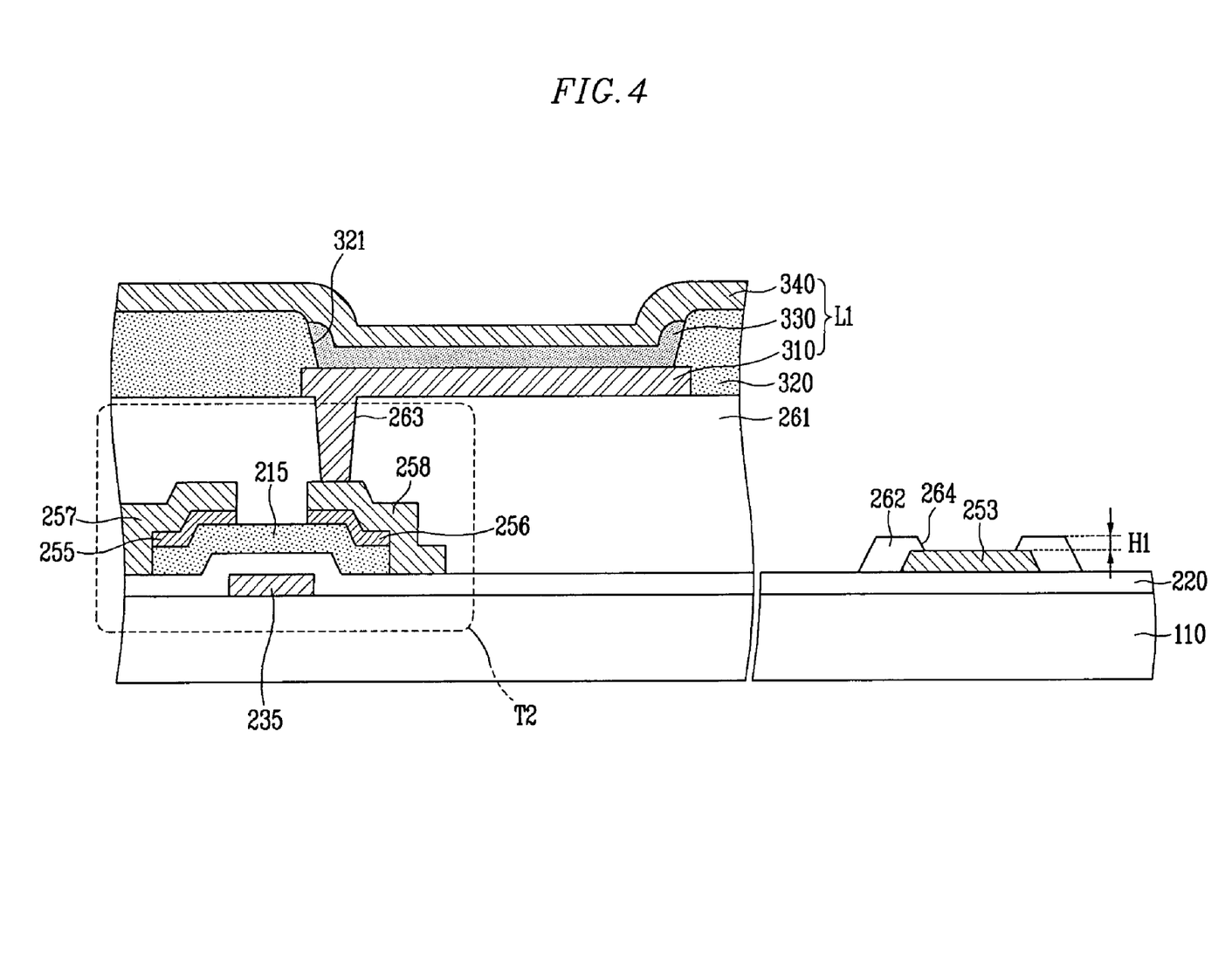
FIG. 4 illustrates a cross-sectional view of a flat panel display according to another embodiment of the present invention.

For example, as shown in FIG. 4, the TFT may have a structure where the gate insulating layer 220, an active layer 215, and source and drain electrodes 257 and 258 are stacked on the gate electrode 235 in that order. In this case, the pad 253 may be formed on the gate insulating layer 220, and ohmic layers 255 and 256 may also be formed between the active layer 215 and the source and drain electrodes 257 and 258.

Referring again to FIG. 1, a first planarizing layer 261 may be formed on the intermediate insulating layer 240 so as to cover the TFT T2 in the pixel region A1. A second planarizing layer 262 may be formed on the intermediate insulating layer 240 in the non-pixel region A2. The second planarizing layer 262 may be thinner than the first planarizing layer 261, and may have also a pad contact hole 264 opening the pad 253.

The second planarizing layer 262 may be formed so as to cover the whole sides and an upper portion in the edge of the pad 253 and expose the intermediate insulating layer 240 between the pads 253.

In this case, the adhesive property between the substrate 110 and a sealing member (not shown) at the non-pixel region A2 may be improved when sealing the substrate 110 with an encapsulate glass (not shown) using the sealing member, since the contact size between the sealing member and the second planarizing layer 262 decreases although the adhesive property between the second planarizing layer 262 and a sealing member is poor. Furthermore, although the pad 253 may have a structure with a sensitive material sandwiched therein, e.g., a Ti/Al/Ti structure where a first titanium (Ti) layer, an aluminum (Al) layer and a second titanium (Ti) are stacked in that order, the sensitive layer, e.g., the Al layer may be covered by the second planarizing layer 262, so that the pad 253 is not damaged.

Figure 5A:
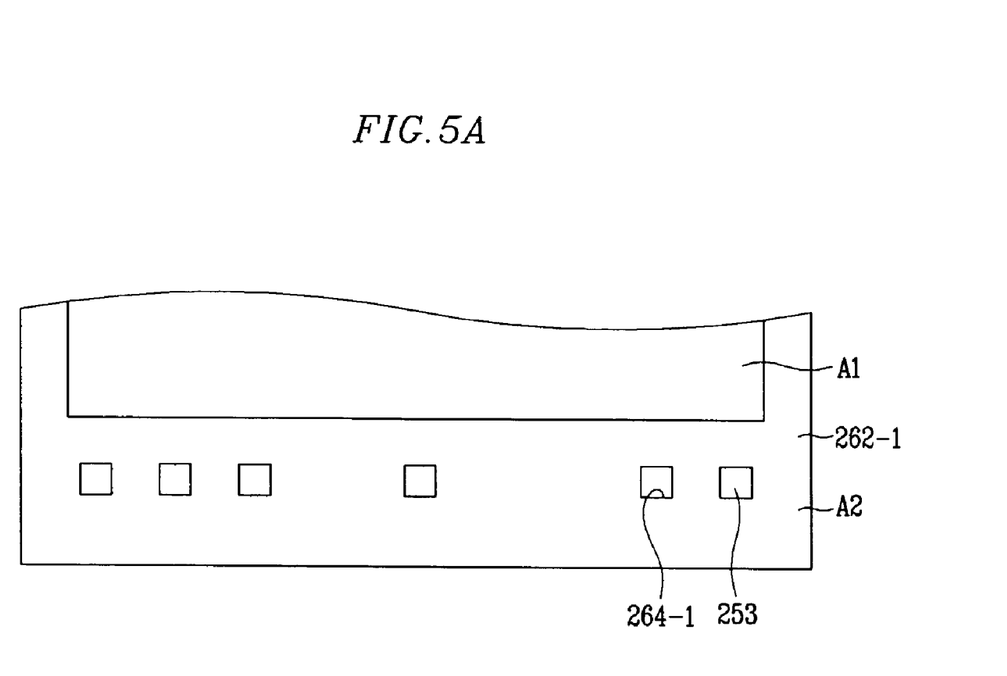
FIGS. 5A and 5B, FIG. 6 and FIG. 7 illustrate a flat panel display according to still other embodiments of the present invention.
Figure 5B:
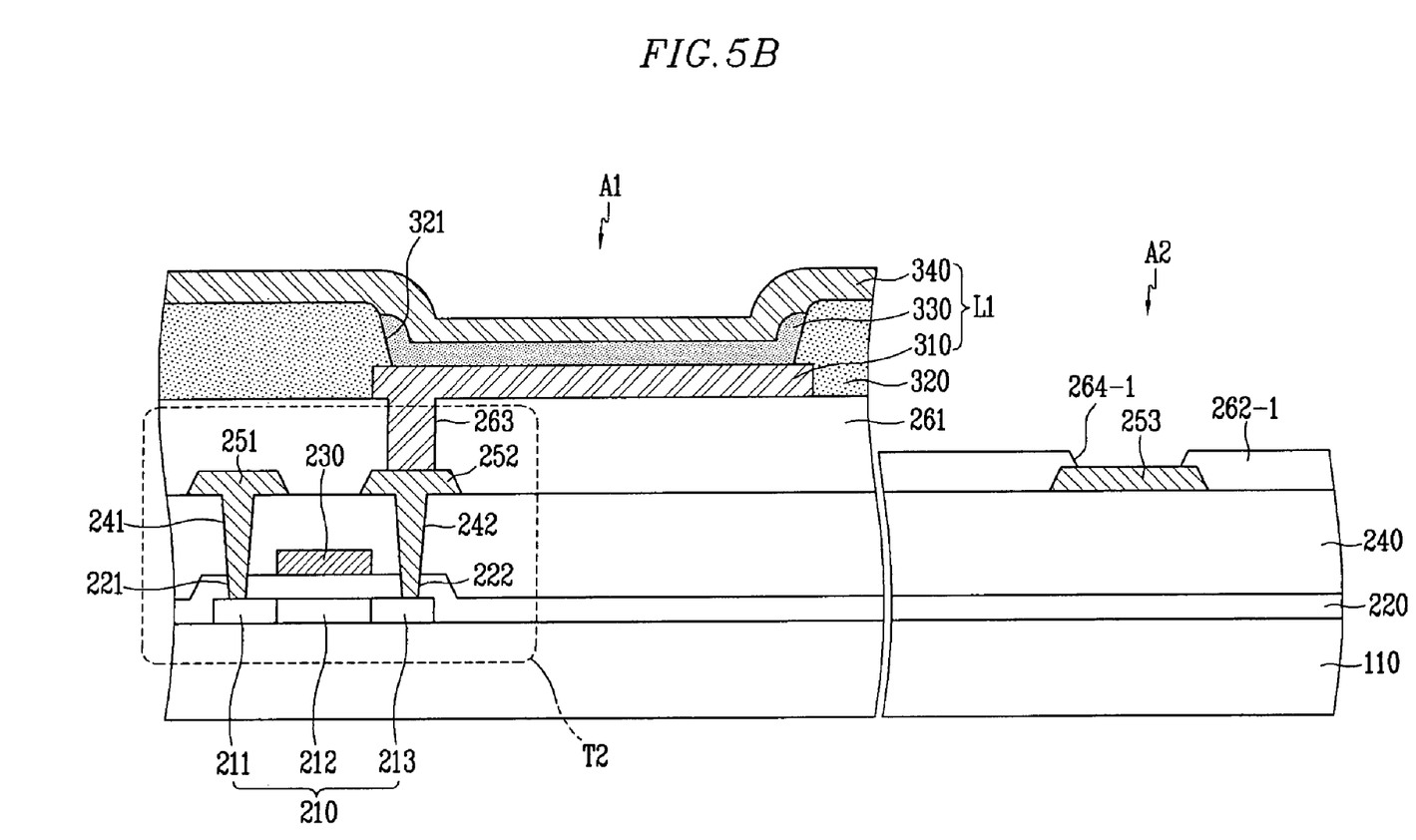

Alternatively, a second planarizing layer 262-1 may be formed on the overall surface of the intermediate insulating layer 240 in the non-pixel region A2 so as to cover the whole sides and the upper portion in the edge of the pad 253, while exposing the pad 253 through a pad contact hole 264-1, as shown in FIGS. 5A and 5B.

Figure 6:
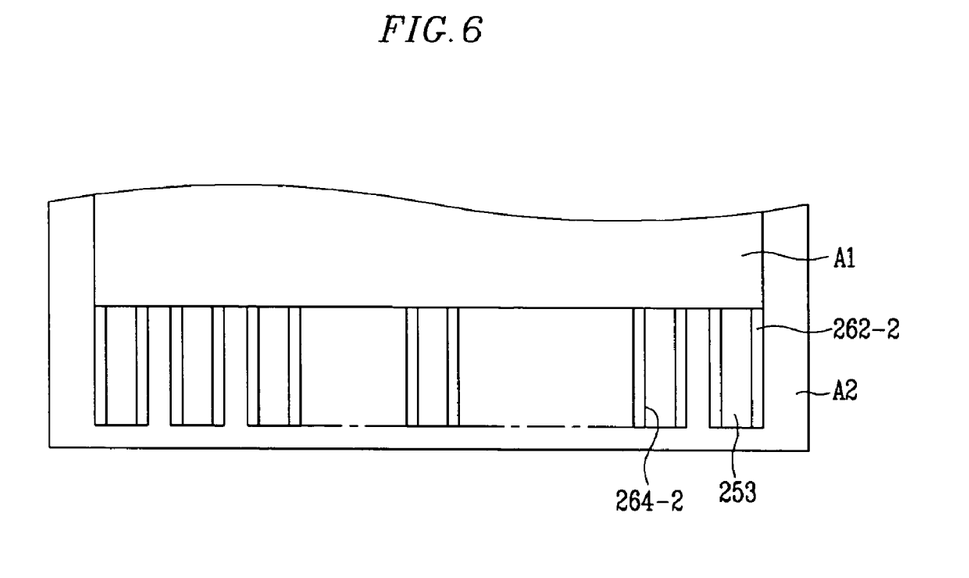

Alternatively, a second planarizing layer 262-2 may be formed so as to cover both sides and the upper portion in the edge of the pad 253 and expose the intermediate insulating layer 240 between the pads 253, while exposing the pad 253 through a pad contact hole 264-2, as shown in FIG. 6.

Figure 7:
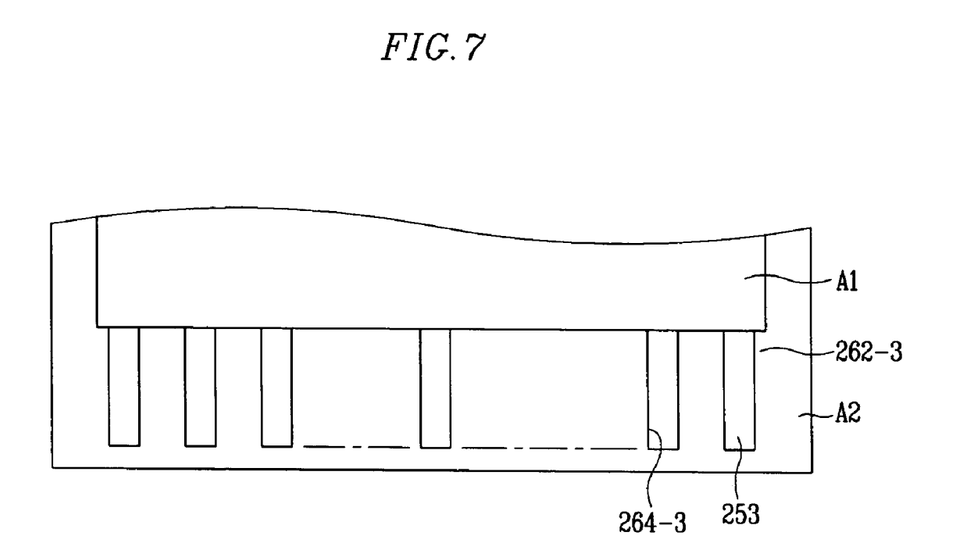

Alternatively, a second planarizing layer 262-3 may be formed on the overall surface of the intermediate insulating layer 240 in the non-pixel region A2 so as to cover both sides and the upper portion in the edge of the pad 253, while exposing the pad 253 through a pad contact hole 264-3, as shown in FIG. 7.

The second planarizing layer 262 may be thicker than the pad 253 in order to cover the sides and the upper portion in the edge of the pad 253. The second planarizing layer 262 may be thinner than a conductive ball (not shown) so that the conductive ball is sufficiently compressed when connecting a FPC and a COG to the pad 253 using the adhesive such as the ACF to insure contact.

For example, if the conductive ball has a diameter of about 3 to 5 μm in the COG, and the conductive ball of FPC has a diameter of about 5 to 10 μm, a thickness of the second planarizing layer 262 may be determined in consideration of the diameters of the conductive balls, e.g., a height H1 that the second planarizing layer 262 extends above the pad 253 may be less than about 3 μm.

The first and second planarizing layers 261 and 262 may be made of a same material, e.g., an organic material, such as a photosensitive organic material. For example, the first and second planarizing layers 261 and 262 may be made of acryl or photosensitive benzocyclobutene (BCB).

The planarizing layer 262 provided on the pad 253 of the data line DL1 (refer to FIG. 1) is illustrated in this embodiment. However, the planarizing layer is not limited to the illustration, but may be altered in various manners.

As above described, in this embodiment, the second planarizing layer 262 of the non-pixel region A2 may be thinner than the first planarizing layer 261 of the pixel region A1 to decrease the height difference between the pad 253 and the second planarizing layer 262 in the non-pixel region A2. As a result, the adhesive property may be improved and contact failure may be prevented when connecting the FPC and COG to the pad 253.

Figure 8A:
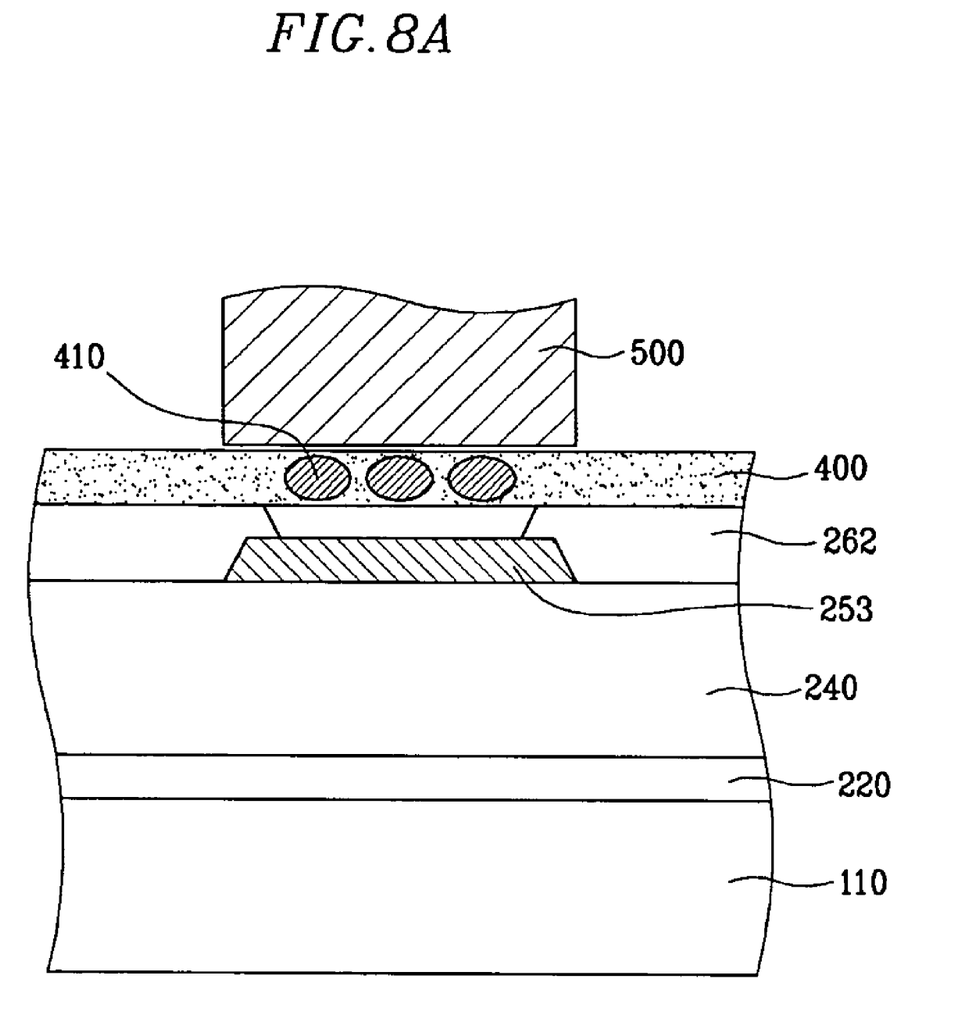
FIGS. 8A and 8B illustrate cross-sectional views in stages of a process of connecting COG to pads in the flat panel display according to an embodiment of the present invention.
Figure 8B:
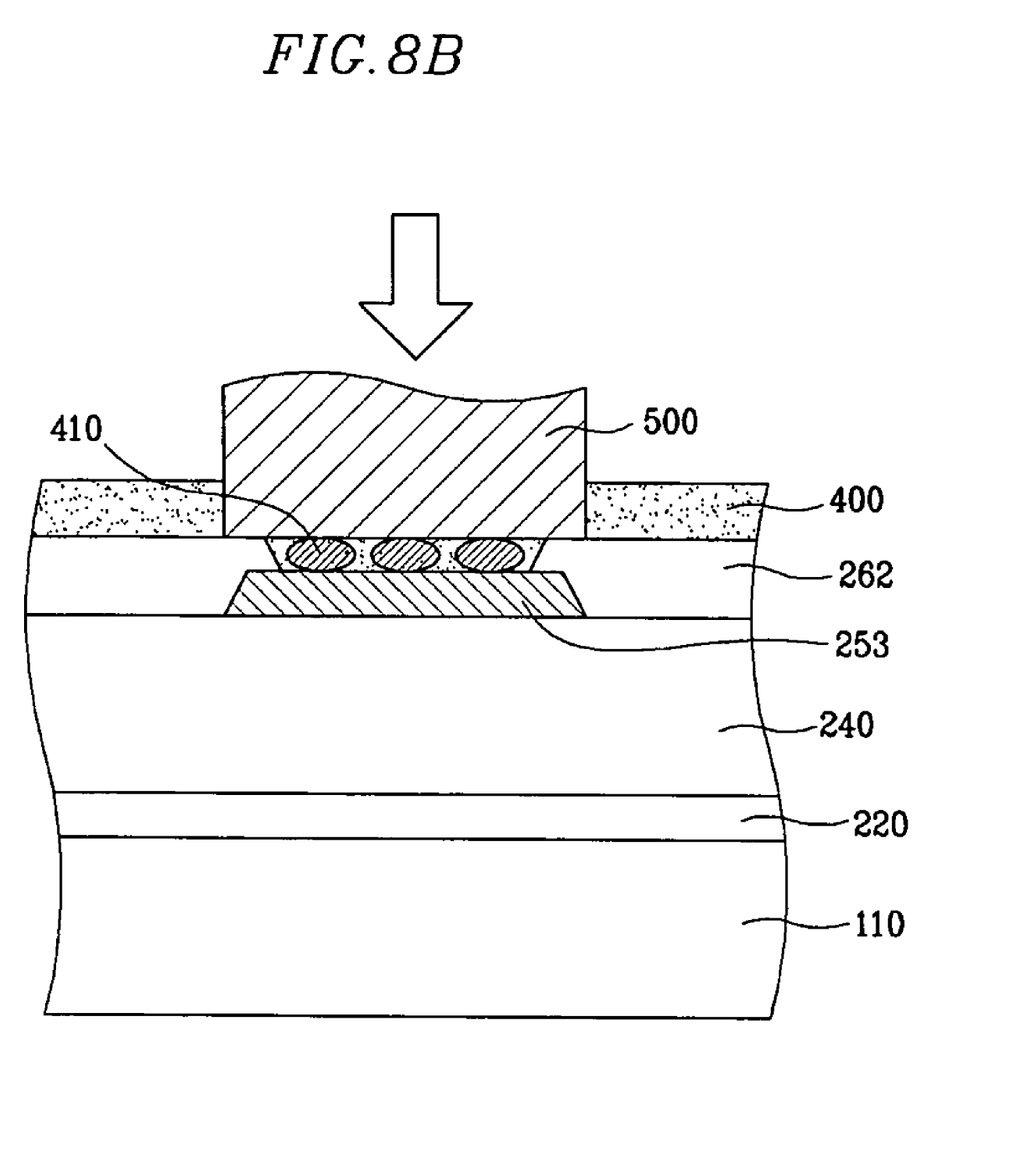

For example, as shown in FIGS. 8A and 8B, in case of connecting a COG 500, having only its bump portion shown in the drawings, to the pad 253 using an ACF 400, conductive balls 410 may be sufficiently compressed, since a height difference between the pad 253 and the second planarizing 262 is small. Therefore, the adhesive property is improved and contact failure does not occur between the pad 253 and the COG 500.

Figure 3:
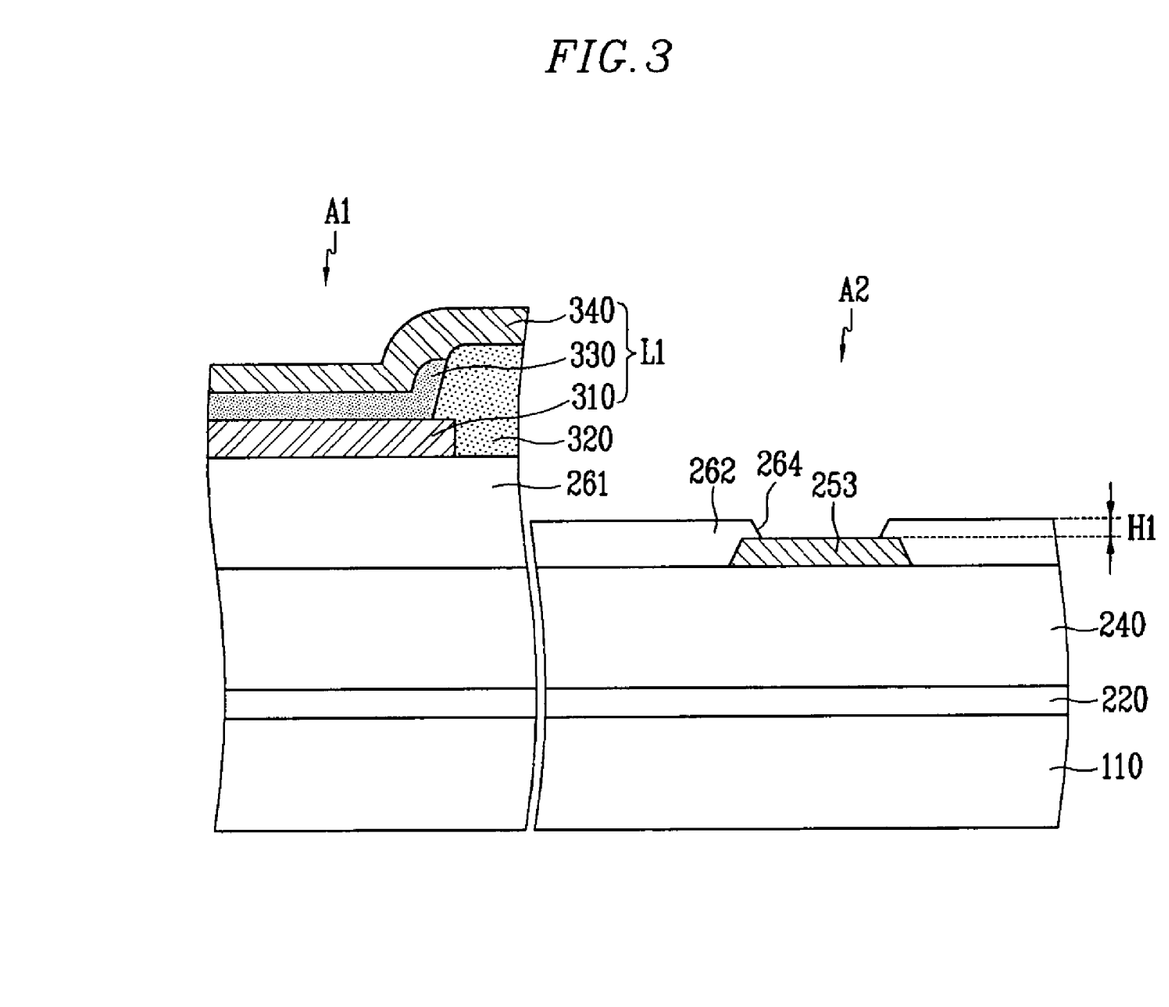
FIG. 3 illustrates a cross-sectional view of the flat panel display taken along line III-III' of FIG. 1.

Further, as shown in FIGS. 2 and 3, the light emitting element L1 may include a first electrode 310, an organic light emitting layer 330 and a second electrode 340 stacked in that order on the first planarizing layer 261 in the pixel region A1. The first electrode 310 may be electrically connected to the drain electrode 252 of the TFT T2 through a via hole 263 provided in the first planarizing layer 261. The first electrode 310 may be isolated from first electrodes (not shown) of adjacent pixels by a pixel definition layer 320, and may contact the organic light emitting layer 330 through an opening 321 provided in the pixel definition layer 320.

The first electrode 310 and the second electrode 340 may be made of, e.g., one or more of ITO (Indium Tin Oxide), IZO (Indium Zinc Oxide), Al, Mg—Ag, Ca, Ca/Ag and Ba.

The organic light emitting layer 330 may be a low molecular weight organic material, e.g., copper phthalocyanine (CuPc), N,N'-Di(naphthalene-1-yl)-N,N'-diphenyl-benzidine (NPB), tris-8-hydroxyquinoline aluminum (Alq3), etc., or, alternatively, a high molecular weight organic material. In other implementations, the organic light emitting layer 330 may have a hole transport layer (HTL), a hole injection layer (HIL), an electron injection layer (EIL) and an electron transport layer (ETL).

A method of manufacturing the OLED according to the embodiment shown in FIG. 2 will be described with reference to FIGS. 9A to 9E. The same components as FIG. 1 to FIG. 3 are denoted by the same reference numerals in FIGS. 9A to 9E, and, therefore, detailed explanation thereof will be omitted in this embodiment.

Figure 9A:
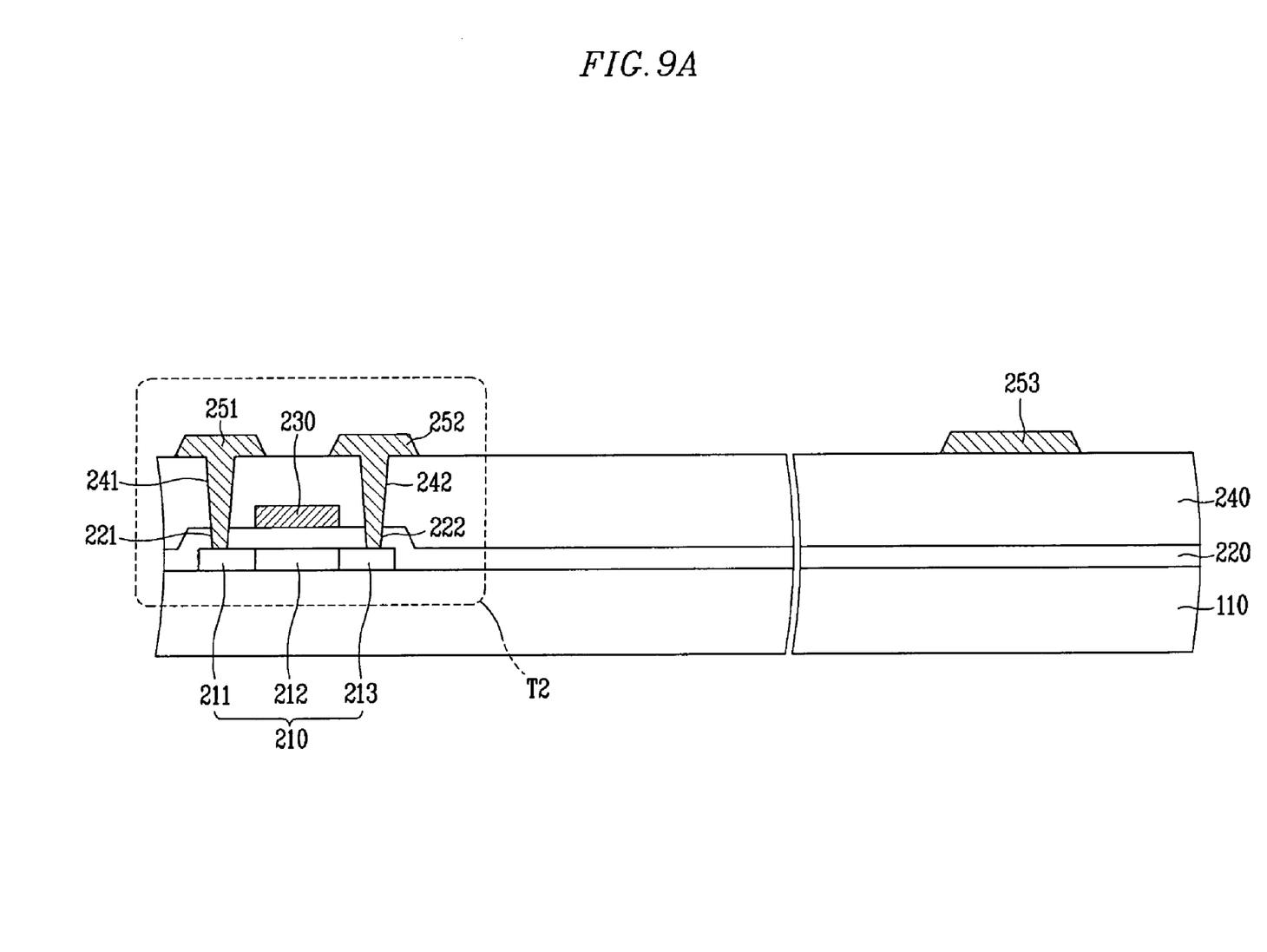
FIGS. 9A to 9E illustrate cross-sectional views of stages in a method of manufacturing the flat panel display according to an embodiment of the present invention.

Referring to FIG. 9A, the substrate 110 where the pixel region A1 (refer to FIG. 1) and the non-pixel region A2 (refer to FIG. 1) are defined, may be provided. The active layer 210 may then be formed on the substrate 110 of the pixel region A1. The active layer 210 may be formed, e.g., by depositing an amorphous silicon layer, crystallizing the amorphous silicon layer using an excimer laser annealing (ELA) to form a polycrystalline silicon (polysilicon) layer, and patterning the polysilicon layer. A buffer layer (not shown) may also be formed on the substrate 110 before depositing the amorphous layer, in order to prevent impurities of the substrate 110 from diffusing into the amorphous silicon layer when performing the ELA.

Next, the gate insulating layer 220 may be formed on the overall surface of the substrate 110 so as to cover the active layer 210. A metal layer, e.g., MoW, Al, Cr or Al/Cr, may be deposited on the gate insulating layer 220 and may be patterned to form the gate electrode 230 corresponding to a center portion, i.e., the channel region in FIG. 2. Impurities of N type or P type may then be doped into both sides of the active layer 210 using, e.g., a mask process and an ion-implantation process to form the source and drain regions 211 and 212. The intermediate insulating layer 240 may be formed on the gate insulating layer 220 so as to cover the gate electrode 230. The gate insulating layer 220 and the intermediate insulating layer 240 above the source and drain regions 211 and 212 may then be patterned to form the first contact holes 221 and 241 and the second contact holes 222 and 242 in the gate insulating layer 220 and the intermediate insulating layer 240, respectively.

Thereafter, a metal layer, e.g., an Al layer such as Ti/Al or Ti/Al/Ti, may be deposited on the first contact holes 221 and 241, the second contact holes 222 and 242 and the intermediate insulating layer 240. The metal layer may be patterned to form the source and drain electrodes 251 and 252 electrically connected with the source and drain region 211 and 212, thereby completing the TFT T2 in the pixel region A1 and the pad 253 in the non-pixel region A2.

Figure 9B:
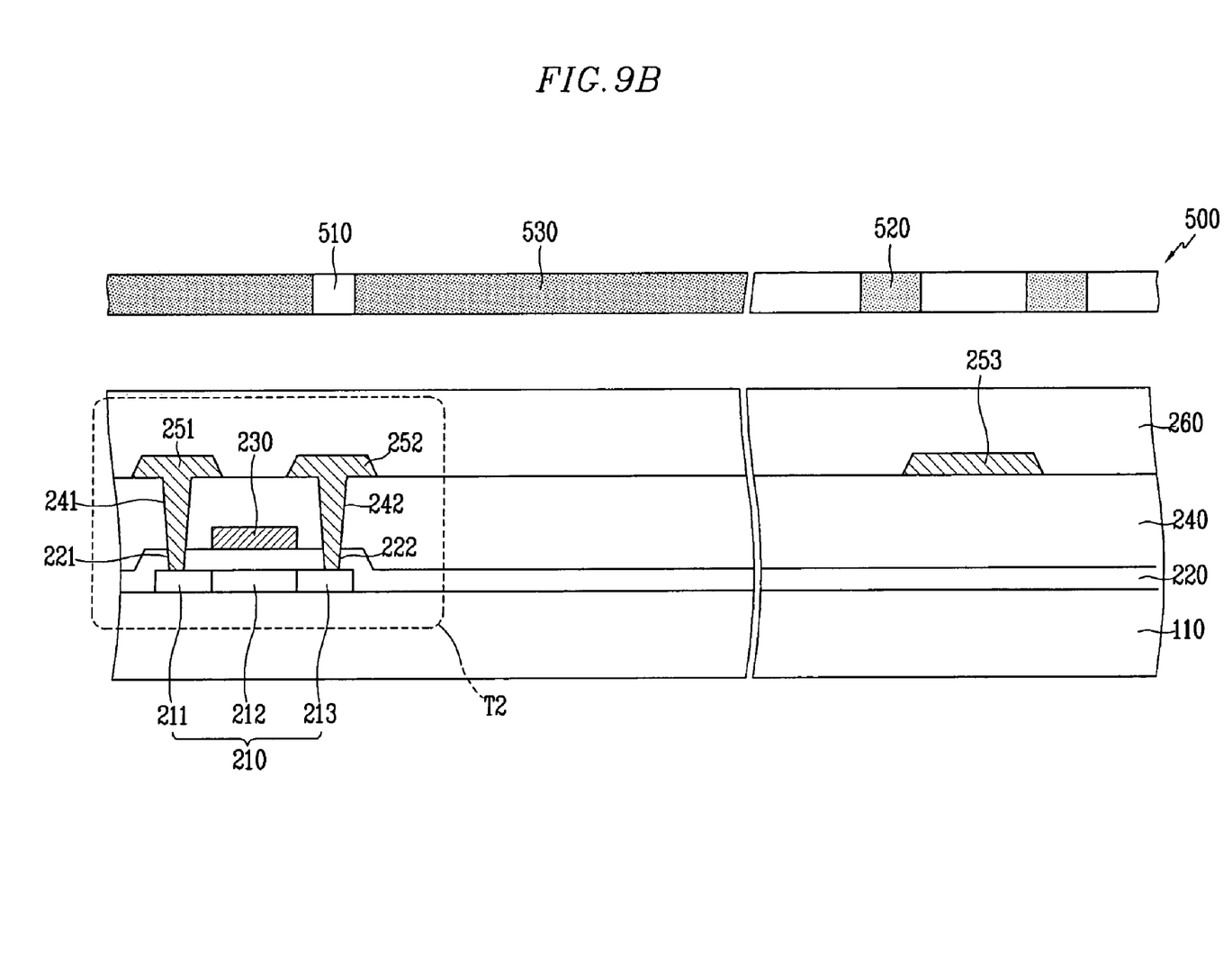

Referring to FIG. 9B, a planarizing layer 260 may be formed on the overall surface of the intermediate insulating layer 240 so as to cover the TFT T2. The planarizing layer 260 may be made of a photosensitive organic material, e.g., acryl or photosensitive benzocyclobutene (BCB).

The planarizing layer 260 may then be exposed, e.g., using a halftone photo mask 500. The halftone photo mask 500 may include a first region 510 transmitting light to the planarizing layer 260 corresponding to the drain electrode 252, the pad 253 and a peripheral portion of the pad 253, a second region 520 transmitting part of the light, e.g., half of the light, to the planarizing layer 260 corresponding to the edge of the pad 253, and a third region 530 blocking the light to the planarizing layer 260 corresponding to the other portions of the substrate 110.

Alternatively, the planarizing layer 260 may be exposed using a first photo mask, and then may be re-exposed using a second photo mask having different light transmission regions from the first photo mask. One of the first and second photo masks may include a first region, i.e., the first region 510, transmitting the light to the planarizing layer 260 corresponding to the drain electrode 252, the pad 253 and a peripheral portion of the pad 253 and a second region blocking the light transmits to the planarizing layer 260 corresponding to the other portions of the substrate 110. The other photo mask may include a first region transmitting light to the planarizing layer 260 corresponding to the non-pixel region A2 and a second region blocking light from the planarizing layer 260 corresponding to the other portions of the substrate 110.

Figure 9C:
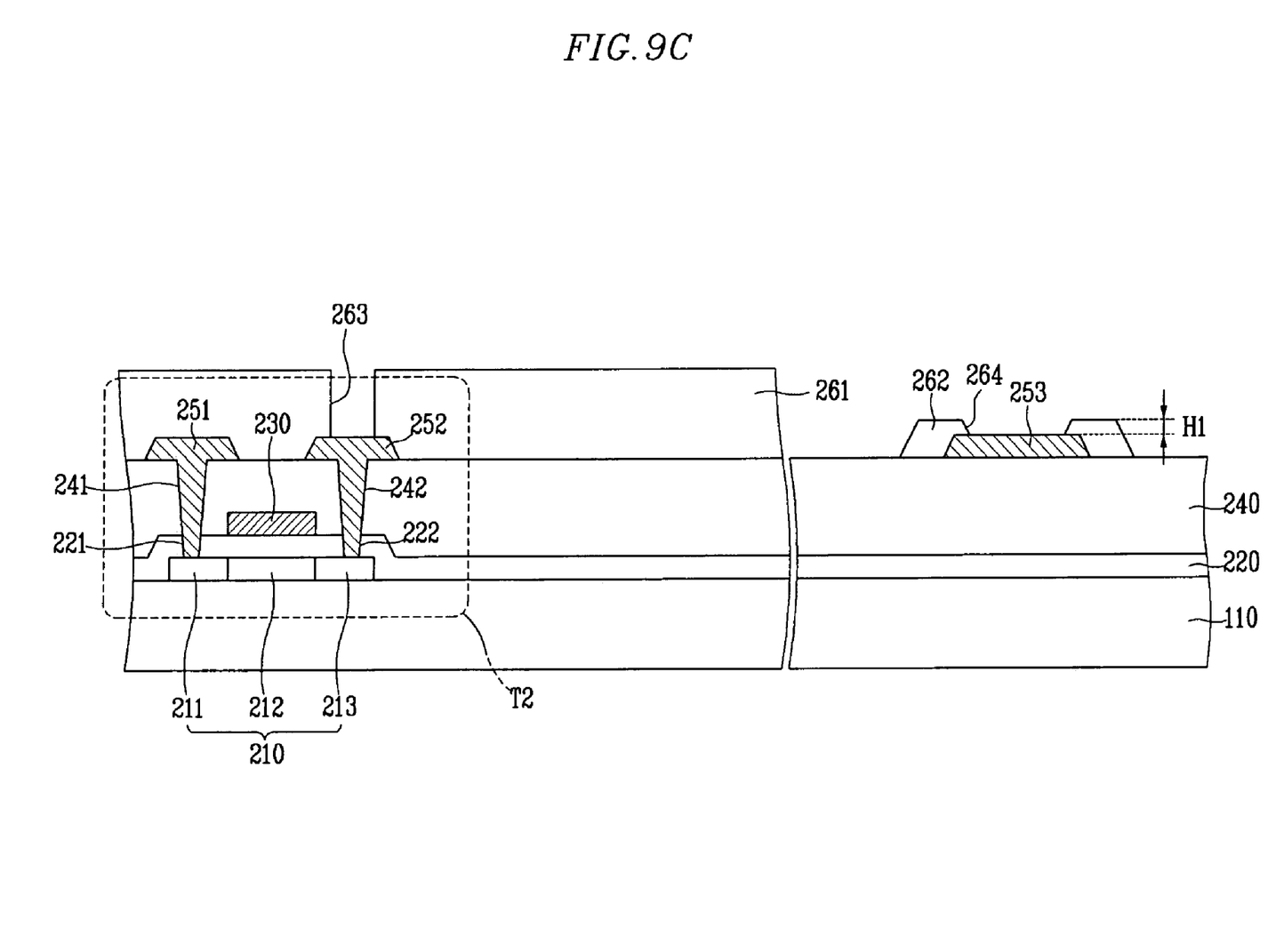

Next, the exposed planarizing layer 260 may be developed. Referring to FIG. 9C, the first planarizing layer 261 may be formed in the pixel region A1 and the second planarizing layer 262 may be formed in the non-pixel region A2, as shown in FIG. 9C. The first planarizing layer 261 may have the via hole 263 exposing the drain electrode 252. The second planarizing layer 262 may have the pad contact hole 264 opening the pad 253, and may be thinner than the first planarizing layer 261.

Figure 9D:
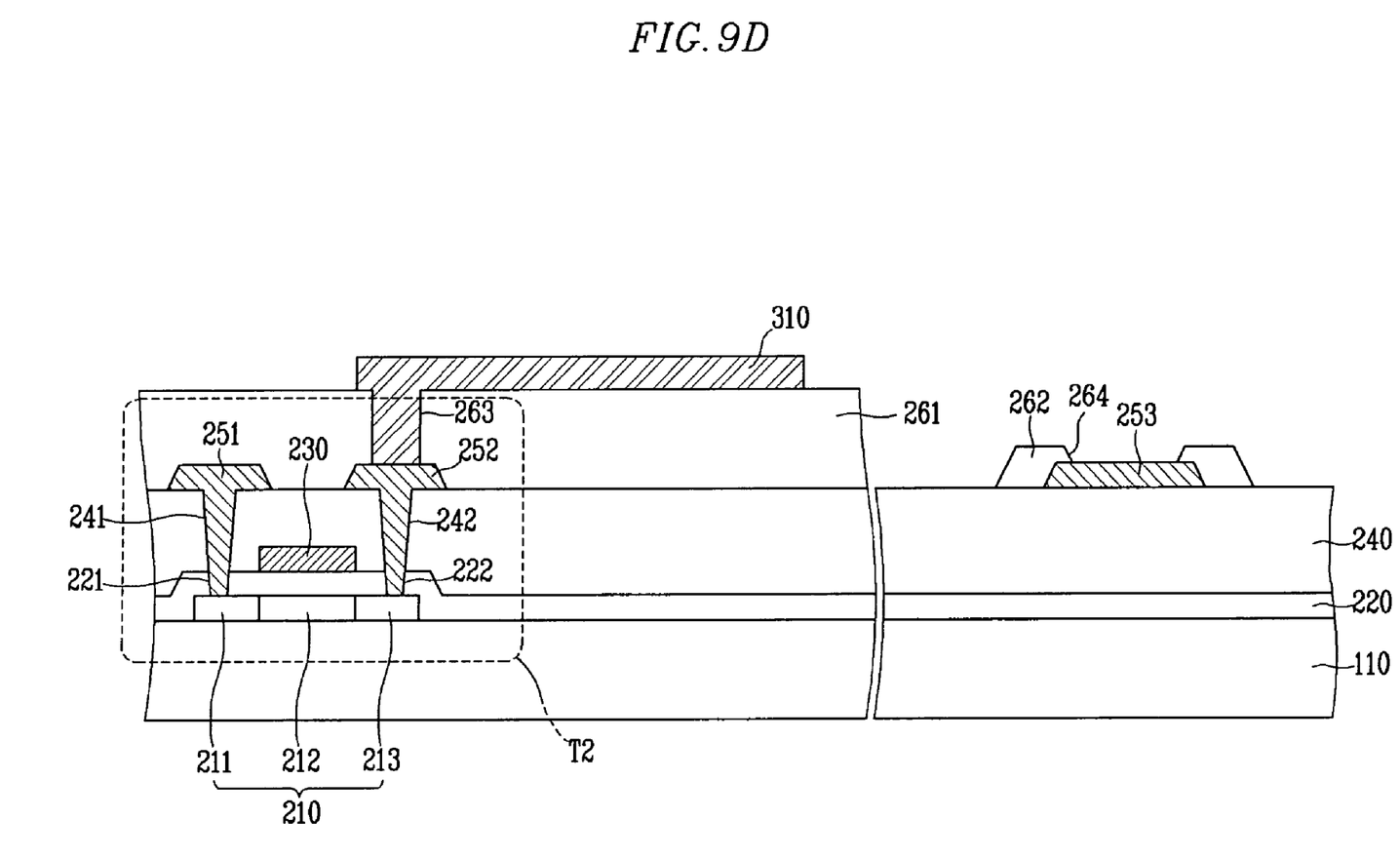

Referring to FIG. 9D, the first electrode 310 may be formed on the first planarizing layer 261 in the pixel region A1 by, e.g., depositing and patterning a first metal layer. The first electrode 310 may be electrically connected to the drain electrode 252 through the via hole 262. At this time, since the edge of the pad 253 is covered with the second planarizing layer 262 in the non-pixel region A2, sides of the pad 253, particularly vulnerable materials, e.g., Al, are not damaged.

Figure 9E:
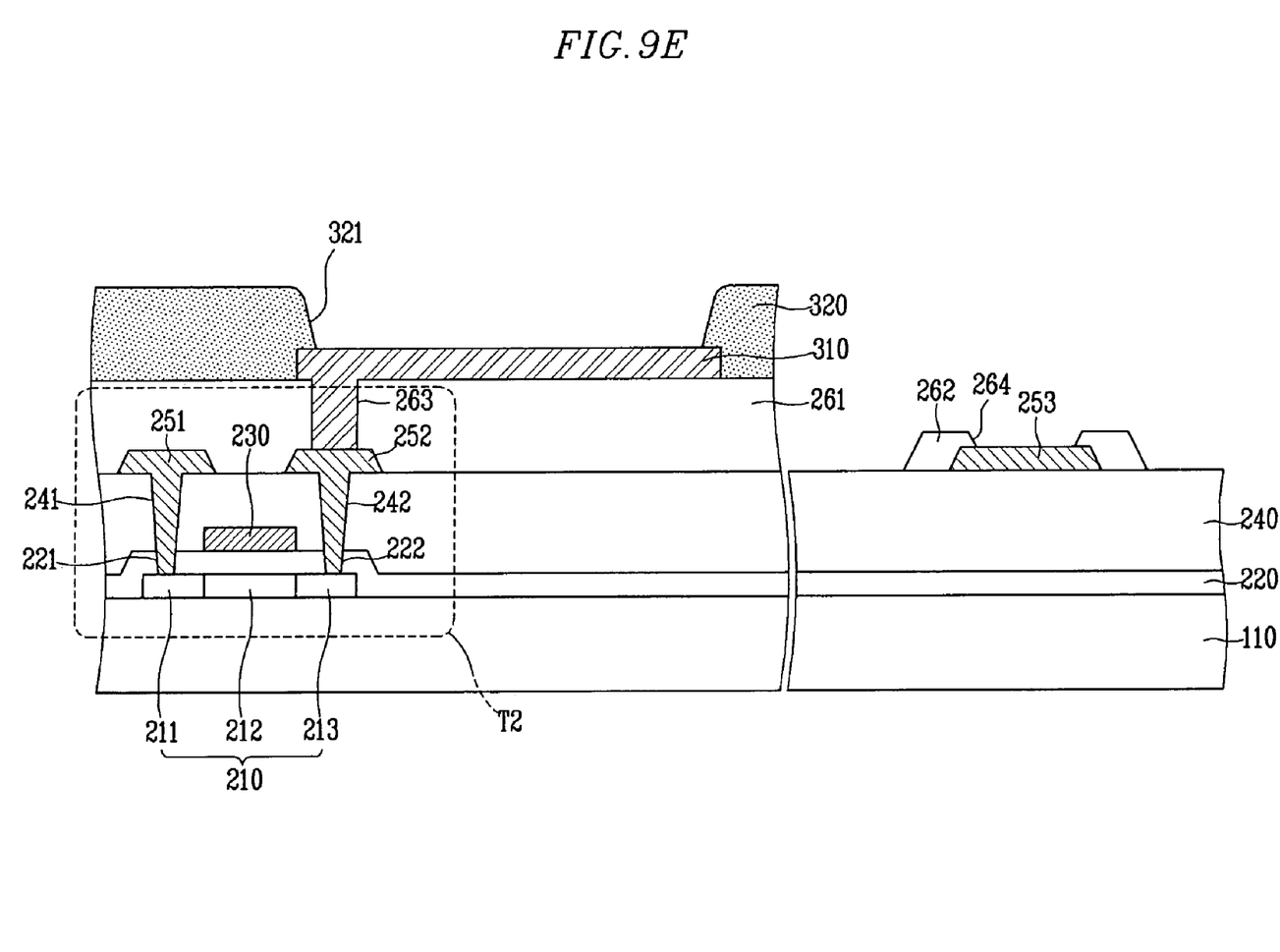

Referring to FIG. 9E, the pixel definition layer 320 may be formed on the surface of the substrate 110 so as to cover the first electrode 310. The pixel definition layer 320 may then patterned, e.g., exposed and developed, to form the opening 321 exposing the first electrode 310 in the pixel region A1 and to remove the pixel definition layer 320 in the non-pixel region A2. Next, the organic light emitting layer 330 may be formed on the first electrode 310, and the second electrode 340 may be formed thereon, to complete the light emitting element L1 in the pixel region A1.

The planarizing layer of the OLED has been illustrated herein. However, the planarizing layer not limited to use with an OLED, and may also be applied to planarizing other flat panel displays, e.g., a liquid crystal display, and may otherwise be altered in various manners.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A flat panel display, comprising:
   a substrate including a pixel region and a non-pixel region, the substrate having a transistor in the pixel region and a pad in the non-pixel region;
   a first planarizing layer disposed in the pixel region covering the transistor and including a via hole exposing a portion of the transistor; and
   a second planarizing layer in the non-pixel region and having a pad contact hole opening the pad,
   the second planarizing layer being thinner than the first planarizing layer.

2. The flat panel display as claimed in claim 1, wherein the second planarizing layer covers whole sides and an upper portion of the edge of the pad.

3. The flat panel display as claimed in claim 2, wherein the second planarizing layer exposes a space between adjacent pads.

4. The flat panel display as claimed in claim 1, wherein the second planarizing layer covers both sides and an upper portion of the edge of the pad.

5. The flat panel display as claimed in claim 4, wherein the second planarizing layer exposes a space between adjacent pads.

6. The flat panel display as claimed in claim 1, wherein the first and second planarizing layers are made of a same material.

7. The flat panel display as claimed in claim 6, wherein the first and second planarizing layers are discontinuous.

8. The flat panel display as claimed in claim 1, further comprising a light emitting element formed on the pixel region and connected to the transistor through the via hole.

9. The flat panel display as claimed in claim 8, wherein the light emitting element comprises a first electrode, an organic light emitting layer and a second electrode stacked in that order.

10. The flat panel display as claimed in claim 1, wherein the pad contacts conductive balls and a thickness of the second planarizing layer on the pad is smaller than a diameter of the conductive ball.

11. A method of manufacturing a flat panel display, comprising:
   providing a substrate including a pixel region and a non-pixel region, the substrate having a transistor in the pixel region and a pad in the non-pixel region;
   forming a planarizing layer on the pixel and non-pixel regions; and
   patterning the planarizing layer to form a first planarizing layer in the pixel region and a second planarizing layer in the non-pixel region, the first planarizing layer having a via hole exposing a portion of the transistor, the second planarizing layer having a pad contact hole opening the pad and being thinner than the first planarizing layer.

12. The method as claimed in claim 11, wherein the second planarizing layer covers whole sides and an upper portion of the edge of the pad.

13. The method as claimed in claim 12, wherein the second planarizing layer exposes a space between adjacent pads.

14. The method as claimed in claim 11, wherein the second planarizing layer covers both sides and an upper portion of the edge of the pad.

15. The method as claimed in claim 14, wherein the second planarizing layer exposes a space between adjacent pads.

16. The method as claimed in claim 11, wherein the planarizing layer is made of a photosensitive organic material.

17. The method as claimed in claim 16, wherein the patterning of the planarizing layer comprises:
   exposing the planarizing layer using a halftone photo mask as a photo mask; and
   developing the exposed planarizing layer.

18. The method as claimed in claim 16, wherein the patterning of the planarizing layer comprises:
   exposing the planarizing layer using a first photo mask;
   re-exposing the exposed planarizing layer using a second photo mask having different transmission regions from the first photo mask; and
   developing the re-exposed planarizing layer.

19. The method as claimed in claim 11, further comprising forming a light emitting element on the first planarizing layer, the light emitting element electrically connecting with the transistor through the via hole.

20. The method as claimed in claim 11, wherein forming the light emitting element comprises stacking first electrode, an organic light emitting layer and a second electrode in that order on the first planarizing layer.

\* \* \* \* \*